(12) United States Patent
Hara et al.

(10) Patent No.: US 7,254,090 B2
(45) Date of Patent: Aug. 7, 2007

(54) SEMICONDUCTOR MEMORY DEVICE

(75) Inventors: Kota Hara, Kawasaki (JP); Akira Kikutake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 11/340,471

(22) Filed: Jan. 27, 2006

(65) Prior Publication Data

US 2007/0091715 A1  Apr. 26, 2007

(30) Foreign Application Priority Data

Oct. 20, 2005  (JP) ............................. 2005-306233

(51) Int. Cl.
*G11C 8/00* (2006.01)
(52) U.S. Cl. ..................... 365/239; 365/233; 365/191
(58) Field of Classification Search ................ 365/239, 365/233, 191, 233.5, 195, 189.04, 194
See application file for complete search history.

(56) References Cited

U.S. PATENT DOCUMENTS

| | | | |
|---|---|---|---|
| 2001/0047464 A1 | 11/2001 | Shinozaki | |
| 2004/0165472 A1 | 8/2004 | Yamazaki | |
| 2005/0226090 A1* | 10/2005 | Lee | ............................ 365/233 |
| 2006/0203576 A1* | 9/2006 | Nishimura et al. | ......... 365/194 |

FOREIGN PATENT DOCUMENTS

| | | |
|---|---|---|
| EP | 1 406 267 A1 | 4/2004 |
| JP | 2000-207882 A | 7/2000 |
| JP | 2004-259400 A | 9/2004 |

* cited by examiner

*Primary Examiner*—Anh Phung
*Assistant Examiner*—Dang Nguyen
(74) *Attorney, Agent, or Firm*—Arent Fox, LLP.

(57) ABSTRACT

An internal address generating circuit sequentially generates internal addresses in the burst read operation, with an external address being set as an initial value. A memory core has plural memory cells and sequentially outputs, in response to activation of a column selection signal, data read from the memory cells corresponding to the internal addresses in the burst read operation. In the burst read operation, a column control circuit in a memory core control circuit repeats activation of the column selection signal for a certain period during an activation period of an external control signal and forcibly deactivates the column selection signal in synchronization with deactivation of the external control signal. In the burst read operation, an operation state control circuit in the memory core control circuit deactivates an operation state control signal after a predetermined time has elapsed from the deactivation of the external control signal.

5 Claims, 5 Drawing Sheets

SEMICONDUCTOR MEMORY DEVICE

CROSS REFERENCE TO RELATED APPLICATION

This application is based upon and claims the benefit of priority from Japanese Patent Application No. 2005-306233, filed on Oct. 20, 2005, the entire contents of which are incorporated herein by reference.

BACKGROUND OF THE INVENTION

1. Field of the Invention

The present invention relates to a semiconductor memory device having a burst operation function 2. Description of the Related Art As recent portable electronic devices such as a cellular phone has been highly advanced, a data volume handled therein has been on the rise. Accordingly, there has been a demand for a work memory mounted in the portable electronic device to have a larger capacity. Conventionally, the portable electronic device has used a SRAM (Static Random Access Memory) as a work memory because of its easy system configurability. However, the SRAM has a drawback that it requires a larger number of elements to constitute one memory cell than a DRAM (Dynamic Random Access Memory), therefore, the SRAM is not suitable for use in devices requiring a larger capacity. In view of this, a semiconductor memory device called a pseudo SRAM having both a larger capacity of the DRAM and usability of the SRAM has been developed.

Generally, a semiconductor memory device with a memory core of the DRAM such as the pseudo SRAM has a burst operation function for realizing a high-speed access operation. For example, in the burst read operation, upon one read command input, internal addresses are sequentially generated with an external address inputted together with read command being set as an initial value, and data read from memory cells corresponding to the internal addresses are sequentially outputted in synchronization with an external clock signal.

Japanese Unexamined Patent Application Publication No. 2004-259400 and Japanese Unexamined Patent Application Publication No. 2000-207882 disclose techniques relating to the burst operation function of the semiconductor memory device, for example. In particular, Japanese Unexamined Patent Application Publication No. 2004-259400discloses a technique for realizing a burst operation with no limitation to a burst length. Japanese Unexamined Patent Application Publication No. 2000-207882 discloses a technique of improving memory access efficiency in a system controlling a plurality of SDRAMs (Synchronous DRAMs) by shortening a memory cycle when the burst operation function is used.

In the semiconductor memory device such as the pseudo SRAM, it is necessary to secure a certain length of time in a period from the deactivation of an external control signal for forcible termination of the burst read operation, up to the re-activation of the external control signal for start of a subsequent access operation. Note that the external control signal is a signal for instructing the start/end of the burst read operation (for example, a chip enable signal). Accordingly, a minimum standard value called recovery time is set for a deactivation period of the external control signal when the burst read operation is forcibly terminated. The recovery time, if long, gives an adverse effect to a high-speed access operation.

In the semiconductor memory device such as the pseudo SRAM, when the external control signal is deactivated in order to forcibly terminate the burst read operation during an activation period of a column selection signal supplied to a memory core, the column selection signal is kept activated for a certain length of time although it is unnecessary. Further, in the semiconductor memory device such as the pseudo SRAM, an operation state control signal is deactivated in response to the deactivation of the column selection signal after the securement of the time to ensure the operation of the memory core. Note that the operation state control signal is a signal for instructing the activation/deactivation of the memory core (for example, a row address strobe signal). The activation period of the column selection signal continues even after the deactivation of the external control signal, unnecessarily delaying the deactivation timing of the operation state control signal and lengthening an activation period of the memory core after the deactivation of the external control signal more than necessary. As a result, the recovery time at the forced termination of the burst read operation is elongated.

SUMMARY OF THE INVENTION

It is an object of the present invention to shorten the recovery time at a time when a burst read operation is forcibly terminated.

According to one aspect of the present invention, a semiconductor memory device has a burst read operation function and it includes an internal address generating circuit, a memory core, and a memory core control circuit. The internal address generating circuit sequentially generates internal addresses in the burst read operation, with an external address being set as an initial value. The memory core has a plurality of memory cells and sequentially outputs data in the burst read operation in response to activation of a column selection signal, the data being read from the memory cells corresponding to the internal addresses. In the burst read operation, a column control circuit in the memory core control circuit repeats an operation of activating the column selection signal for a certain period of time during an activation period of an external control signal and forcibly deactivates the column selection signal in synchronization with deactivation of the external control signal. The external control signal is a signal for instructing start/end of the burst read operation. In the burst read operation, an operation state control circuit in the memory core control circuit deactivates an operation state control signal after a predetermined time has elapsed from the deactivation of the external control signal. The operation state control signal is a signal for instructing activation/deactivation of the memory core. Further, the predetermined time is, for example, a time needed to ensure an operation of the memory core after the deactivation of the column selection signal.

According to a preferable example of the above-described aspect of the present invention, a reset circuit in the memory core resets, to a predetermined potential, a plurality of bit lines connected to the plural memory cells respectively during an activation period of a reset signal. A reset control circuit in the memory core control circuit activates the reset signal in response to the deactivation of the operation state control signal.

According to a preferable example of the above-described aspect of the present invention, a column control circuit includes a reference signal generating circuit and a first output circuit. In the burst read operation, the reference signal generating circuit repeats an operation of activating a reference column selection signal for a certain period of time. In the burst read operation, the first output circuit outputs the reference column selection signal as the column selection signal during the activation period of the external control signal, and forcibly terminates an operation of outputting the reference column selection signal as the column selection signal in synchronization with the deactivation of the external control signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
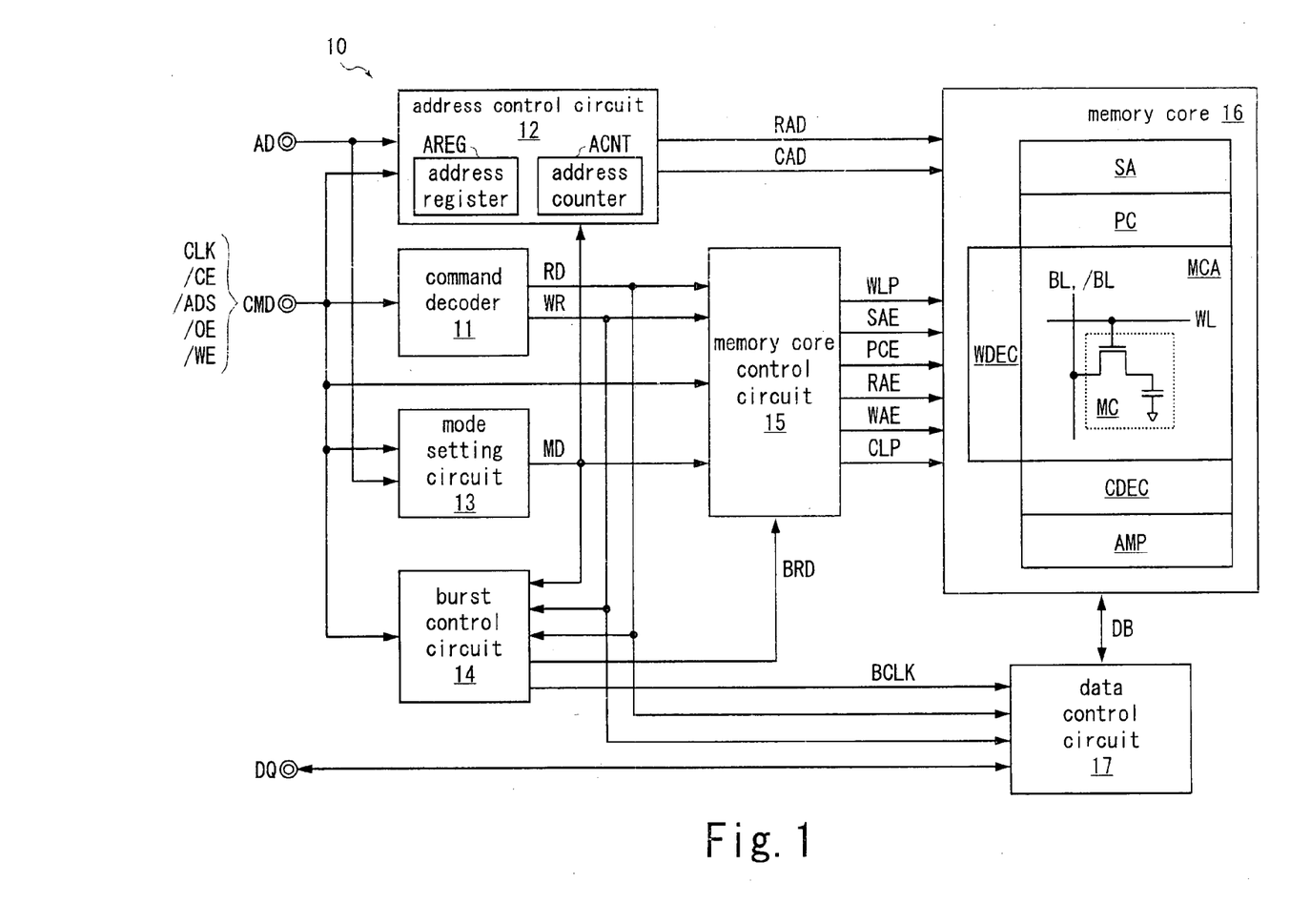
FIG. 1 is a block diagram showing one embodiment of the present invention.

Hereinafter, an embodiment of the present invention will be described with reference to the drawings. Note that in the following description terminals and signals supplied via the terminals are expressed with the same reference symbols. Further, signals without a slash "/" are positive logic signals, and signals with a slash "/" are negative logic signals. FIG. 1 shows one embodiment of the present invention. A semiconductor memory device 10 is constituted as, for example, a pseudo SRAM having a burst operation function, and has a command decoder 11, an address control circuit 12 (an internal address generating circuit), a mode setting circuit 13, a burst control circuit 14, a memory core control circuit 15, a memory core 16, and a data control circuit 17.

The command decoder 11 activates a read signal RD when decoding a command signal CMD supplied via a command terminal CMD and detecting a read command. The command decoder 11 activates a write signal WR when decoding the command signal CMD and detecting a write command. The command decoder 11 deactivates the read signal RD and the write signal WR when decoding the command signal CMD and detecting an operation end command. For example, the command signal CMD includes an external clock signal CLK, an external address signal AD, a chip enable signal/CE, an address status signal/ADS, an output enable signal/OE, a write enable signal/WE, and so on.

The address control circuit 12 has an address register AREG and an address counter ACNT. The address register AREG latches the external address signal AD supplied via an address terminal AD, in synchronization with the deactivation (a rising edge) of the address status signal/ADS supplied via an address status terminal/ADS. Further, the address register AREG sequentially latches counter value signals outputted from the address counter ACNT when an operation mode indicated by a mode signal MD is a burst mode. The address register AREG outputs the latched signals as a row address signal RAD and a column address signal CAD. When the operation mode indicated by the mode signal MD is the burst mode, the address counter ACNT executes a count operation, determining a register value of the address register AREG at the time the external address signal AD is latched to be an initial value.

The mode setting circuit 13 has a mode register settable via the command signal CMD. The mode register sets the operation mode, a burst length, latency, and so on. The mode setting circuit 13 outputs a register value of the mode register as the mode signal MD. When the operation mode indicated by the mode signal MD is the burst mode, the burst control circuit 14 outputs the read signal RD as a burst read signal BRD. When the operation mode indicated by the mode signal MD is not the burst mode, the burst control circuit 14 outputs a signal indicating "0" as the burst read signal BRD. That is, the burst read signal BRD is activated in the burst read operation. When the operation mode indicated by the mode signal MD is the burst mode, during an activation period of the read signal RD or the write signal WR, the burst control circuit 14 outputs a burst clock signal BCLK in synchronization with the external clock signal CLK according to the burst length, the latency, and so on indicated by the mode signal MD.

The memory core control circuit 15 generates a word selection signal WLP, a sense amplifier enable signal SAE, a precharge enable signal PCE, a read amplifier enable signal RAE, a write amplifier enable signal WAE, and a column selection signal CLP based on the read signal RD, the write signal WR, the command signal CMD, the mode signal MD, and the burst read signal BRD. The memory core control circuit 15 will be described in detail later with reference to FIG. 2.

The memory core 16 has a word decoder unit WDEC, a sense amplifier unit SA, a precharge unit PC (a reset circuit), a memory cell array unit MCA, a column decoder unit CDEC, and an amplifier unit AMP. The memory cell array unit MCA has a plurality of volatile memory cells MC arranged in matrix at intersections of a plurality of word lines WL and a plurality of bit lines BL, /BL. Each of the memory cells MC is the same as a memory cell of a typical DRAM, and has a capacitor for retaining data as charges and a transfer transistor connected between the capacitor and the corresponding bit line BL (or bit line/BL). A gate of the transfer transistor in each of the memory cells MC is connected to the corresponding word line WL.

The word decoder unit WDEC activates the word line WL corresponding to the row address signal RAD in an activation period of the word selection signal WLP. The sense amplifier unit SA is constituted of a plurality of sense amplifiers provided to correspond to the plural bit line pairs BL, /BL, respectively. Each of the sense amplifiers amplifies a voltage difference in the corresponding bit line pair BL, /BL in an activation period of the sense amplifier enable signal SA. The precharge unit PC is constituted of a plurality of precharge circuits provided to correspond to the plural bit line pairs BL, /BL respectively. Each of the precharge circuits connects the corresponding bit line pair BL, /BL to a precharge voltage line in an activation period of the precharge enable signal PCE. Therefore, each of the bit line pairs BL, /BL is initialized to a precharge voltage in the activation period of the precharge enable signal PCE.

The column decoder unit CDEC activates a column selection line corresponding to the column address signal CAD among a plurality of column selection lines in an activation period of the column selection signal CLP. The column decoder unit CDEC has a plurality of column switches provided to correspond to the plural bit lines BL, /BL respectively. Each of the column switches connects the corresponding bit line BL (or bit line/BL) to an internal data bus in response to the activation of the corresponding column selection line. The amplifier unit AMP amplifies a signal amount of data on the internal data bus to output it to a data bus DB in an activation period of the read amplifier enable signal RAE. The amplifier unit AMP amplifies a signal amount of data on the data bus DB to output it to the internal data bus in an activation period of the write amplifier enable signal WAE.

In the activation period of the read signal RD, the data control circuit 17 converts parallel read data, which are outputted from the memory core 16 to the data bus DB, into serial data, and sequentially outputs the serial data to a data terminal DQ in synchronization with the burst clock signal BCLK. In the activation period of the write signal WR, the data control circuit 17 sequentially accepts serial write data supplied via the data terminal DQ in synchronization with the burst clock signal BCLK, and converts the accepted serial data into parallel data to output the parallel data to the data bus DB.

Figure 2:
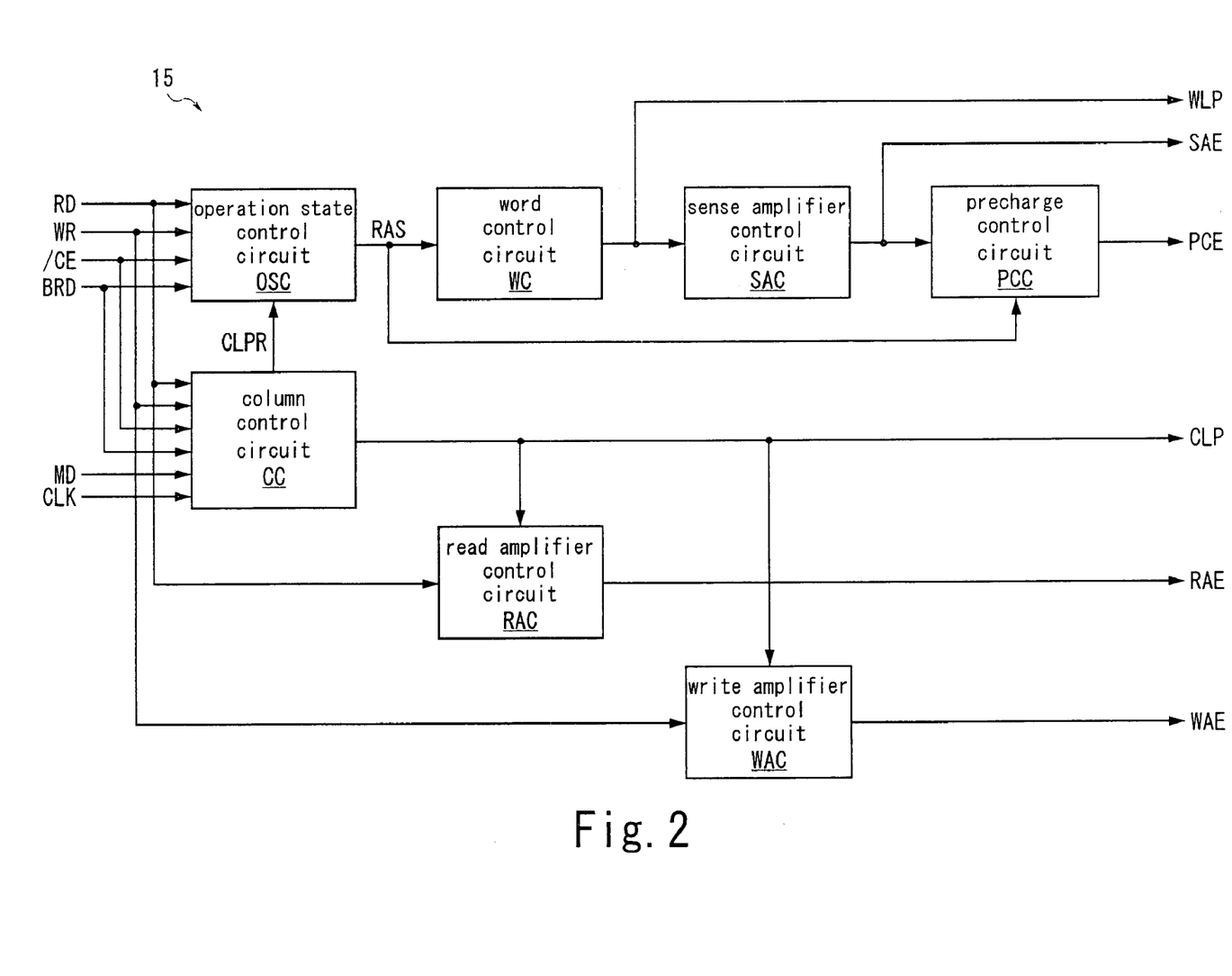
FIG. 2 is a block diagram showing a memory core control circuit in FIG. 1.

FIG. 2 shows the memory core control circuit 15 in FIG. 1. The memory core control circuit 15 has an operation state control circuit OSC, a word control circuit WC, a sense amplifier control circuit SAC, a precharge control circuit PCC (a reset control circuit), a column control circuit CC, a read amplifier control circuit RAC, and a write amplifier control circuit WAC. The operation state control circuit OSC generates a row address strobe signal RAS based on the read signal RD, the write signal WR, the chip enable signal/CE, the burst read signal BRD, and a reference column selection signal CLPR. The operation state control circuit OSC will be described in detail later with reference to FIG. 3.

The word control circuit WC activates the word selection signal WLP in response to the activation of the row address strobe signal RAS. The word control circuit WC deactivates the word selection signal WLP in response to the deactivation of the row address strobe signal RAS. The sense amplifier control circuit SAC activates the sense amplifier enable signal SAE in response to the activation of the word selection signal WLP. The sense amplifier control circuit SAC deactivates the sense amplifier enable signal SAE in response to the deactivation of the word selection signal WLP.

The precharge control circuit PCC activates the precharge enable signal PCE in response to the deactivation of the sense amplifier enable signal SAE. The precharge control circuit PCC deactivates the precharge enable signal PCE in response to the activation of the row address strobe signal RAS. The column control circuit CC generates the column selection signal CLP and the reference column selection signal CLPR based on the read signal RD, the write signal WR, the chip enable signal/CE, the burst read signal BRD, the mode signal MD, and the external clock signal CLK. The column control circuit CC will be described in detail later together with the operation state control circuit OSC with reference to FIG. 3. The read amplifier control circuit RAC temporarily activates the read amplifier enable signal RAE in response to the activation of the column selection signal CLP in the activation period of the read signal RD. The write amplifier control circuit WAC temporarily activates the write amplifier enable signal WAE in response to the activation of the column selection signal CLP in the activation period of the write signal WR.

Figure 3:
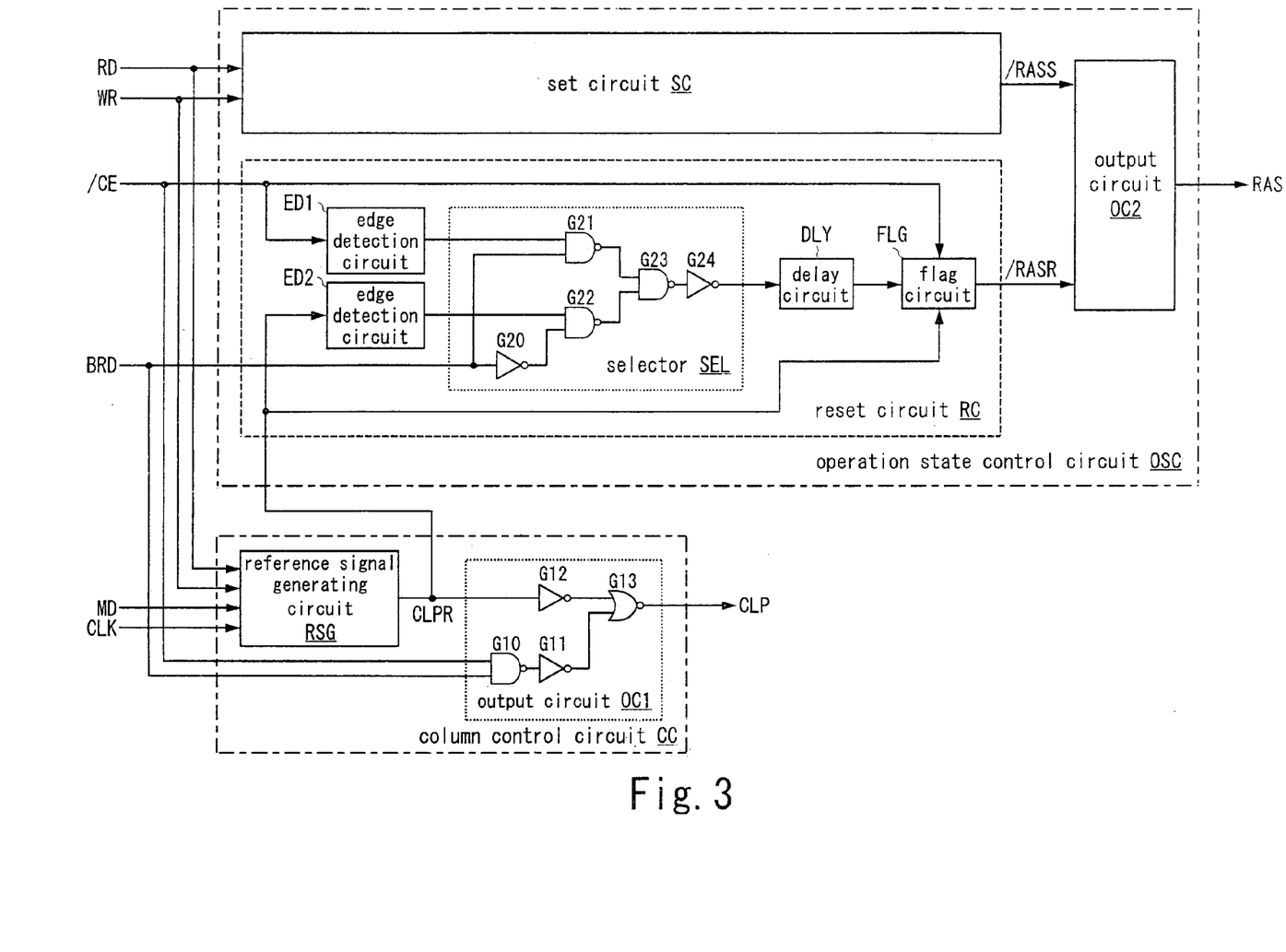
FIG. 3 is a block diagram showing an operation state control circuit and a column control circuit in FIG. 2.

FIG. 3 shows the operation state control circuit OSC and the column control circuit CC in FIG. 2. The column control circuit CC has a reference signal generating circuit RSG and an output circuit OC1 (a first output circuit). When the operation mode indicated by the mode signal MD is the burst mode, the reference signal generating circuit RSG activates the reference column selection signal CLPR for a certain period of time in response to a rising edge of the external clock signal CLK in every 4 cycles of the external clock signal CLK during the activation period of the read signal RD or the write signal WR. Note that the number of times the reference signal generating circuit RSG activates the reference column selection signal CLPR is determined according to the burst length indicated by the mode signal MD.

The output circuit OC1 has a NAND gate G10, inverters G11, G12, and a NOR gate G13. When the burst read signal BRD indicates "1", the NAND gate G10 inverts the chip enable signal/CE to output it. When the burst read signal BRD indicates "0", the NAND gate G10 outputs a signal indicating "1". The inverter G11 inverts the output signal of the NAND gate G10 to output it. The inverter G12 inverts the reference column selection signal CLPR to output it. When the output signal of the inverter G11 indicates "0", the NOR gate G13 inverts the output signal of the inverter G12 to output it. When the output signal of the inverter G11 indicates "1", the NOR gate G13 outputs a signal indicating "0". With such a configuration, in the burst read operation, the output circuit OC1 outputs the reference column selection signal CLPR as the column selection signal CLP in the activation period of the chip enable signal/CE. Further, in the burst read operation, the output circuit OC1 outputs the signal indicating "0" as the column selection signal CLP in synchronization with the deactivation (a rising edge) of the chip enable signal/CE.

The operation state control circuit OSC has a set circuit SC, a reset circuit RC, and an output circuit OC2 (a second output circuit). The set circuit SC activates a set signal/RASS in response to the activation of the read signal RD or the activation of the write signal WR. The set circuit SC deactivates the set signal/RASS in response to the deactivation of the read signal RD or the deactivation of the write signal WR.

The reset circuit RC has an edge detection circuit ED1 (a first detection circuit), an edge detection circuit ED2 (a second detection circuit), a selector SEL (a selection circuit), a delay circuit DLY, and a flag circuit FLG. The edge detection circuit ED1 temporarily activates an output signal to "1" when detecting the deactivation (the rising edge) of the chip enable signal/CE. The edge detection circuit ED2 temporarily activates the output signal to "1" when detecting the deactivation (a falling edge) of the reference column selection signal CLPR.

The selector SEL has inverters G20, G24 and NAND gates G21-G23. The inverter G20 inverts the burst read signal BRD to output it. When the burst read signal BRD indicates "1", the NAND gate G21 inverts the output signal of the edge detection circuit ED1 to output it. When the burst read signal BRD indicates "0", the NAND gate 21 outputs a signal indicating "1". When the output signal of the inverter G20 indicates "1" (i.e., when the burst read signal BRD indicates "0"), the NAND gate G22 inverts the output signal of the edge detection circuit ED2 to output it. When the output signal of the inverter G20 indicates "0" (i.e., when the burst read signal BRD indicates "1"), the NAND gate G22 outputs a signal indicating "1". The NAND gate G23 performs a NAND operation on the output signal of the NAND gate G21 and the output signal of the NAND gate G22 to output the result. The inverter G24 inverts the output signal of the NAND gate G23 to output it. With such a configuration, the selector SEL selects and outputs the output signal of the edge detection circuit ED1 in the burst read operation. On the other hand, the selector SEL selects and outputs the output signal of the edge detection circuit ED2 in access operations excluding the burst read operation (for example, a burst write operation).

The delay circuit DLY outputs a signal which is delayed from the output signal of the selector SEL (the output signal of the inverter G24) by a predetermined time. The predetermined time is a time to ensure the operation of the memory core 16 after the deactivation of the column selection signal CLP (specifically, a restore time of the memory cells MC). The flag circuit FLG shifts from a reset state to a set state in response to the activation (a falling edge) of the output signal of the delay circuit DLY. The flag circuit FLG shifts from the set state to the reset state in response to the activation (a rising edge) of the reference column selection signal CLPR. In a deactivation period of the chip enable signal /CE, the flag circuit FLG being in the set state activates a reset signal/RASR while the flag circuit FLG being in the reset state deactivates the reset signal/RASR. The output circuit OC2 activates the row address strobe signal RAS in response to the activation (a falling edge) of the set signal/RASS. The output circuit OC2 deactivates the row address strobe signal RAS in response to the activation (a falling edge) of the reset signal/RASR.

Figure 4:
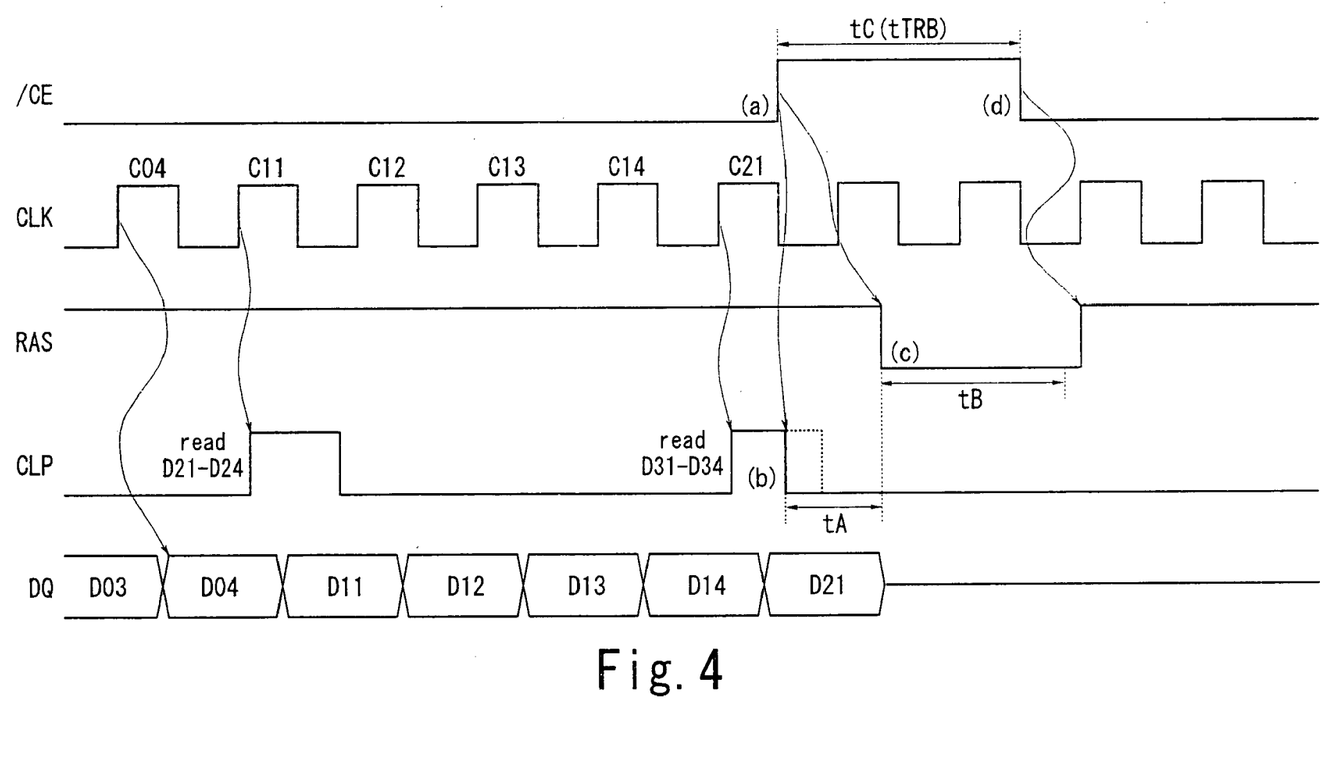
FIG. 4 is a timing chart of main signals when a burst read operation is forcibly terminated according to the embodiment of the present invention.

FIG. 4 shows main signals when a burst read operation is forcibly terminated according to one embodiment of the present invention. When the chip enable signal/CE is deactivated during the activation period of the column selection signal CLP corresponding to the reading of four-word data D31-D34 in order to forcibly terminate the burst read operation (FIG. 4(a)), the column selection signal CLP is forcibly deactivated in synchronization with the deactivation of the chip enable signal/CE (FIG. 4(b)). Then, the row address strobe signal RAS is deactivated after a time tA (the delay time by the delay circuit DLY) passes from the deactivation of the chip enable signal/CE (FIG. 4(c)). In this case, if the chip enable signal/CE is activated 2 cycles of the external clock signal CLK after the deactivation of the chip enable signal/CE (after a time tC passes) (FIG. 4(d)), a deactivation period of the row address strobe signal RAS can satisfy a prescribed time tB. Note that the time tB is a time needed for the memory core 16 to execute a reset operation (precharge operation), or a time needed for the memory core 16 to insert a refresh operation for execution. Therefore, a recovery time tTRB at the forced termination of the burst read operation is determined as the time tC.

Figure 5:
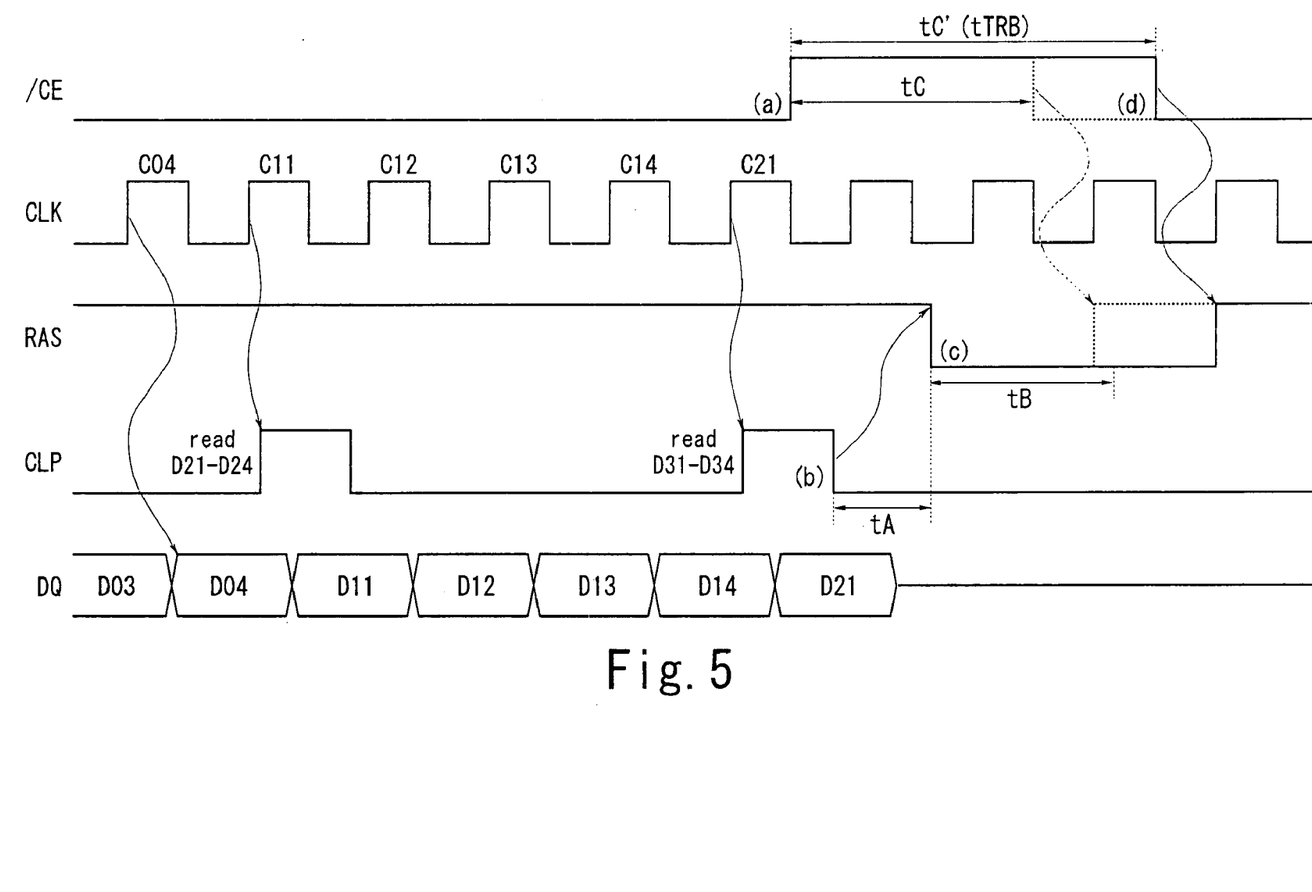
FIG. 5 is a timing chart of main signals when the burst read operation is forcibly terminated according to a comparative example of the present invention.

FIG. 5 shows main signals when a burst read operation is forcibly terminated according to a comparative example of the present invention. Note that a semiconductor memory device in the comparative example of the present invention is the same as the semiconductor memory device 10 of the embodiment of the present invention except in that they have different operation state control circuits and column control circuits of memory core control circuits. The operation state control circuit in the comparative example is configured without the edge detection circuit ED1 and the selector SEL in the reset circuit RC of the operation state control circuit OSC in the embodiment of the present invention, and the output signal of the edge detection circuit ED2 is directly inputted to the delay circuit DLY. The column control circuit in the comparative example is configured without the output circuit OC1 in the column control circuit CC in the embodiment of the present invention, and the reference column selection signal CLPR outputted from the reference signal generating circuit RSG is replaced by the column selection signal CLP.

In the semiconductor memory device as configured above, when the chip enable signal/CE is deactivated during the activation period of the column selection signal corresponding to the reading of the four-word data D31-D34 in order to forcibly terminate the burst read operation (FIG. 5(a)), the column selection signal CLP is deactivated after being kept activated for a certain period of time (FIG. 5(b)). Then, the row address strobe signal RAS is deactivated after the time tA has elapsed from the deactivation of the column selection signal CLP (FIG. 5(c)). In this case, if the chip enable signal/CE is activated 3 cycles of the external clock signal CLK after the deactivation of the chip enable signal/CE (after a time tC' passes) (FIG. 5(d)), the deactivation period of the row address strobe signal RAS can satisfy the prescribed time tB. However, if the chip enable signal/CE is activated 2 cycles of the external clock signal CLK after the deactivation of the chip enable signal/CE (after the time tC passes) as in the embodiment of the present invention, the deactivation period of the row address strobe signal cannot satisfy the prescribed time tB. Therefore, the recovery time tTRB at the forced termination of the burst read operation is determined as the time tC', and thus it is longer than in the embodiment of the present invention (the time tC).

As described hitherto, according to the embodiment of the present invention, when the chip enable signal/CE is deactivated during the activation period of the column selection signal CLP in order to forcibly terminate the burst read operation, the column selection signal CLP is forcibly deactivated in synchronization with the deactivation of the chip enable signal /CE. This can reduce an unnecessary activation period of the column selection signal CLP after the deactivation of the chip enable signal/CE. Further, the row address strobe signal RAS is deactivated after the predetermined time (the delay time of the delay circuit DLY) has elapsed from the deactivation of the chip enable signal/CE. This makes it possible to avoid unnecessarily delaying the deactivation timing of the row address strobe signal RAS, realizing a reduction in an unnecessary activation period of the memory core 16 after the deactivation of the chip enable signal/CE. As a result, it is possible to shorten the recovery time tTRB at the forced termination of the burst read operation, which can realize a higher-speed memory access operation.

The invention is not limited to the above embodiments and various modifications may be made without departing from the spirit and scope of the invention. Any improvement may be made in part or all of the components.

What is claimed is:

1. A semiconductor memory device having a burst read operation function, comprising:
    an internal address generating circuit sequentially generating internal addresses in a burst read operation, with an external address being set as an initial value;
    a memory core having a plurality of memory cells, and sequentially outputting data in the burst read operation in response to activation of a column selection signal, the data being read from the memory cells corresponding to the internal addresses; and
    a memory core control circuit having:
        a column control circuit repeating an operation of activating said column selection signal for a certain period of time during an activation period of an external control signal in the burst read operation, and forcibly deactivating said column selection signal in synchronization with deactivation of the external control signal, the external control signal being for instructing start/end of the burst read operation; and an operation state control circuit deactivating an operation state control signal in the burst read operation after a predetermined time has elapsed from the deactivation of said external control signal, the operation state control signal being for instructing activation/deactivation of said memory core.

2. The semiconductor memory device according to claim 1, wherein:

said memory core comprises a reset circuit which resets a plurality of bit lines to a predetermined potential during an activation period of a reset signal, the plurality of bit lines connected to said plurality of memory cells, respectively; and said memory core control circuit comprises a reset control circuit which activates said reset signal in response to the deactivation of said operation state control signal.

3. The semiconductor memory device according to claim 1, wherein said column control circuit comprises:

a reference signal generating circuit which repeats an operation of activating a reference column selection signal for a certain period of time in the burst read operation; and a first output circuit which outputs said reference column selection signal as said column selection signal during the activation period of said external control signal in the burst read operation, and forcibly terminates an operation of outputting said reference column selection signal as said column selection signal in synchronization with the deactivation of said external control signal.

4. The semiconductor memory device according to claim 3, wherein said operation state control circuit comprises:

a first detection circuit which activates an output signal when detecting the deactivation of said external control signal;

a second detection circuit which activates an output signal when detecting deactivation of said reference column selection signal;

a selection circuit which selects the output signal of said first detection circuit for output in the burst read operation while selecting the output signal of said second detection circuit for output in access operation other than the burst read operation;

a delay circuit which outputs the output signal of said selection circuit with a delay by the predetermined time;

a flag circuit which goes into a set state from a reset state in response to activation of the output signal of said delay circuit and activates an output signal in accordance with the set state/reset state during the deactivation period of said external control signal; and a second output circuit which deactivates said operation state control signal in response to the activation of the output signal of said flag circuit.

5. The semiconductor memory device according to claim 1, wherein the predetermined time is a time needed to ensure an operation of said memory core after the deactivation of said column selection signal.

* * * * *